(12) United States Patent
Chang et al.

(10) Patent No.: US 9,835,951 B2
(45) Date of Patent: Dec. 5, 2017

(54) ROLL TO ROLL LIGHT EXPOSURE SYSTEM

(71) Applicant: SAMSUNG DISPLAY CO., LTD., Yongin-si, Gyeonggi-do (KR)

(72) Inventors: Jae Hyuk Chang, Seongnam-si (KR); Sang Hyun Yun, Suwon-si (KR); Ki Beom Lee, Seoul (KR); Hi Kuk Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 91 days.

(21) Appl. No.: 14/933,896

(22) Filed: Nov. 5, 2015

(65) Prior Publication Data

US 2016/0209756 A1 Jul. 21, 2016

(30) Foreign Application Priority Data

Jan. 15, 2015 (KR) ........................ 10-2015-0007616

(51) Int. Cl.
*G03B 27/58* (2006.01)
*G03F 7/20* (2006.01)
*G03F 7/22* (2006.01)

(52) U.S. Cl.
CPC ............ *G03F 7/70141* (2013.01); *G03F 7/22* (2013.01); *G03F 7/70791* (2013.01)

(58) Field of Classification Search
CPC ..... G03F 7/22; G03F 7/70141; G03F 7/70791
USPC ................................... 355/67, 72
See application file for complete search history.

(56) References Cited

U.S. PATENT DOCUMENTS

| | | | | |
|---|---|---|---|---|
| 5,652,645 A | * | 7/1997 | Jain | ................ G03F 7/2002 355/50 |
| 8,486,593 B2 | | 7/2013 | Haase et al. | |
| 2004/0063596 A1 | * | 4/2004 | Gabric | ................ G03F 7/105 510/176 |
| 2014/0340660 A1 | * | 11/2014 | Suzuki | ................ G03F 9/703 355/53 |

FOREIGN PATENT DOCUMENTS

| | | |
|---|---|---|
| KR | 10-2010-0120769 A | 11/2010 |
| KR | 10-2013-0020404 A | 2/2013 |
| KR | 10-1232611 B1 | 2/2013 |
| KR | 10-1243354 B1 | 3/2013 |
| KR | 10-1301090 B1 | 8/2013 |

\* cited by examiner

*Primary Examiner* — Peter B Kim
(74) *Attorney, Agent, or Firm* — Innovation Counsel LLP

(57) ABSTRACT

Embodiments of the present invention provide a roll-to-roll exposure system having a reference mark array and alignment scope units for precisely measuring the position and orientation of an object on a flexible multilayered circuit film. A roll-to-roll exposure system according to an exemplary embodiment of the present invention includes: a plurality of rolls configured to move a flexible multilayered circuit film having an object positioned thereon; alignment scope units positioned so as to be spaced apart from each other and proximate to the rolls; and at least one exposure unit positioned so as to be spaced proximate to the rolls and spaced apart from sides of the alignment scope units, in which one of the rolls has a reference mark array on its surface.

9 Claims, 6 Drawing Sheets

ROLL TO ROLL LIGHT EXPOSURE SYSTEM

CROSS-REFERENCE TO RELATED APPLICATION

This application claims priority to, and the benefit of, Korean Patent Application No. 10-2015-0007616 filed in the Korean Intellectual Property Office on Jan. 15, 2015, the entire contents of which are incorporated herein by reference.

BACKGROUND (a) Technical Field

Embodiments of the present invention relate generally to flexible circuit fabrication. More specifically, embodiments of the present invention relate to a roll-to-roll exposure system for manufacturing a flexible circuit film.

(b) Description of the Related Art

A roll-to-roll digital exposure system has been disclosed in, for example, U.S. Pat. No. 8,486,593, which is incorporated by reference herein. A roll-to-roll digital exposure system patterns a flexible film carried on rolls or a non-elastic belt or a conveyer, using an image measuring device and an exposing device.

In roll-to-roll systems, an error in overlay may be caused by distortion of the flexible film due to strain bias, absorption of water or solvents, tension in the flexible film, thermal history, and the like. A roll-to-roll digital exposure system minimizes this overlay error by sensing distortion of a flexible film due to those factors and controlling a spot beam from an exposing device accordingly. That is, an image measuring device reads the positions of a plurality of marks on a previous layer of the flexible film, and a computer system determines the amount of distortion of the flexible film by comparing the positions of the marks read by the image measuring device with the positions of reference marks. Then, an exposure unit patterns a subsequent layer by applying an algorithm that corrects for distortion on the basis of the degree of determined distortion.

A roll-to-roll digital exposure system thus uses the positions of an exposure unit and an ASU (Alignment Scope Unit) in a roll-to-roll system in order to minimize overlay in patterning.

In practice, there is a need for an overlay function to manufacture a device with a layered structure (layered circuit film), in which there is a need for a reference mark array for measuring the position of an alignment scope unit and the position and orientation of an object.

Further, optomechanical drift is generated in an off-axis alignment system. The optomechanical drift adds inaccuracy to this overlay function because a base line corresponding to the distance between an alignment scope unit and an exposure position (the position of a beam spot of an exposure unit) is changed. The position of an alignment scope unit should remain more precisely defined to periodically measure drift components.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide a roll-to-roll exposure system having a reference mark array and an alignment scope unit for precision measuring of an object on a flexible multilayered circuit film.

An exemplary embodiment of the present invention provides a roll-to-roll exposure system that includes: a plurality of rolls configured to move a flexible multilayered circuit film having an object positioned thereon; alignment scope units positioned so as to be spaced apart from each other and proximate to the rolls; and at least one exposure unit positioned so as to be spaced proximate to the rolls and spaced apart from sides of the alignment scope units, in which one of the rolls has a reference mark array on its surface.

The rolls may have a degree of freedom in a rotational direction and the alignment scope units may have degrees of freedom in the longitudinal direction of a roll and the rotational direction.

The alignment scope units may be arranged along the longitudinal direction of the rolls.

The reference mark array may comprise engravings or reference marks affixed to the rolls.

Another exemplary embodiment of the present invention provides a roll-to-roll exposure system that includes: two rolls configured to move a flexible multilayered circuit film that has an object positioned thereon; a table disposed between the two rolls and positioned so as to fix and support the flexible multilayered circuit film; alignment scope units disposed over the table; and at least one exposure unit spaced proximate to the table and apart from sides of the alignment scope units, in which the table has a reference mark array on its surface.

The reference mark array may comprise engravings or reference marks affixed to the table.

The table may have a degree of freedom in a width direction (x-axis direction) of the flexible multilayered circuit film and a degree of freedom in a movement direction (y-axis direction) of the flexible multilayered circuit film, and the alignment scope units may have degrees of freedom in the width direction (x-axis direction) and the movement direction (y-axis direction).

The rolls may be configured to move substantially in synchronization with the table such that the table has the degree of freedom in the y-axis direction, and a y-axis directional stroke (Yst) of the table may be determined according to $Yst=r\theta_2$, where $r$ is a radius of the rolls and $\theta_2$ is an angle of rotation of the rolls.

The rolls and the table may each have a degree of freedom in the x-axis direction, so that the rolls are configured to move substantially in synchronization with the table.

As described above, according to an exemplary embodiment of the present invention, a reference mark array is disposed on one of a plurality of rolls (or a table between rolls) for moving a flexible multilayered circuit film. The position and orientation of an alignment scope unit over the rolls (or table) are measured first and the position and orientation of an object on the flexible multilayered circuit film (or table) are measured, so that precise exposure by exposure units can be achieved later.

That is, a coordinate system for a roll (or table) is set by measuring the position of a reference mark array using an alignment scope unit, the roll (or table) is moved such that a predetermined reference mark in the reference mark array is positioned at the center of a field of vision of an alignment scope unit, and then the position of the alignment scope unit is obtained.

Image information about an object on a flexible multilayered circuit film on a roll (or table) is obtained and the position and orientation of the object in the coordinate system for the roll (or table) are measured.

DETAILED DESCRIPTION OF THE EMBODIMENTS

Hereinafter, the present invention will be described more fully hereinafter with reference to the accompanying drawings, in which exemplary embodiments of the invention are illustrated. As those skilled in the art would realize, the described embodiments may be modified in various different ways, all without departing from the spirit or scope of the present invention. The various Figures are not necessarily to scale. All numerical values are approximate, offered for purposes of illustration, and therefore may vary.

Figure 1:
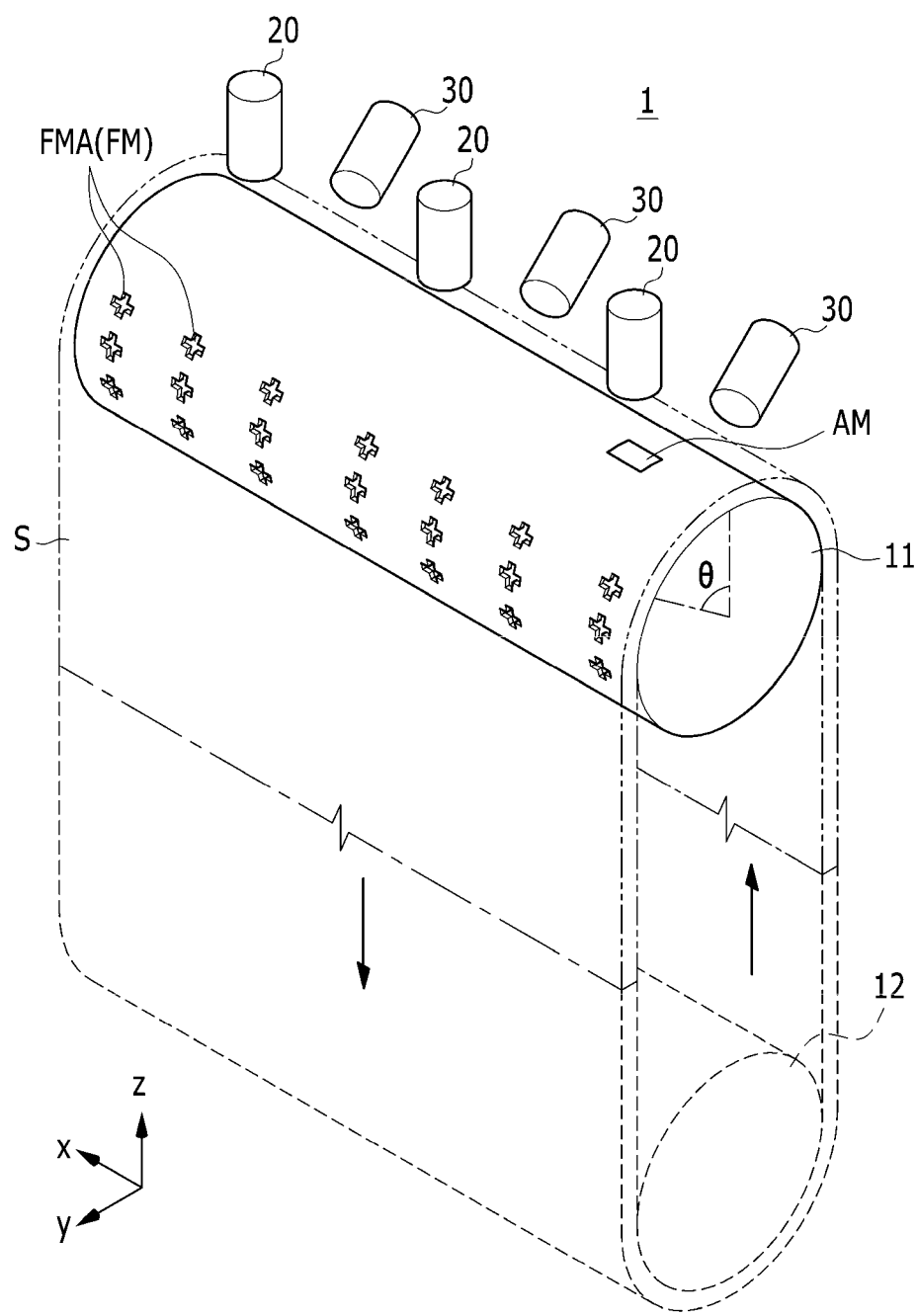
FIG. 1 is a perspective view illustrating a roll-to-roll exposure system according to a first exemplary embodiment of the present invention.
Figure 2:
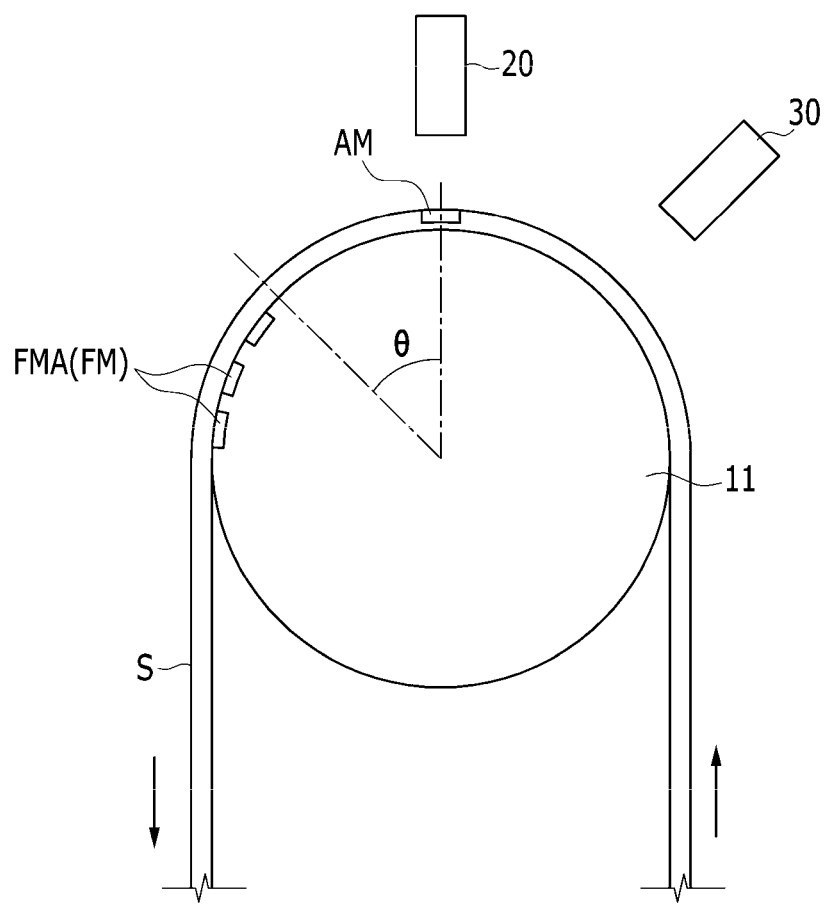
FIG. 2 is a side view of the system of FIG. 1.

FIG. 1 is a perspective view illustrating a roll-to-roll exposure system according to a first exemplary embodiment of the present invention and FIG. 2 is a side view of the system of FIG. 1. Referring to FIGS. 1 and 2, a roll-to-roll exposure system 1 according to a first exemplary embodiment includes a plurality of rolls 11 and 12 that move a flexible multilayered circuit film S, alignment scope units 20 that are spaced apart from the roll 11 of the plurality of rolls 11 and 12, and exposure units 30 that are disposed at sides of the alignment scope units 20. In the embodiment shown, units 20 and units 30 are placed alongside each other along the roll 11 in alternating manner, although this need not necessarily be the case, and any order and placement of units 20 and 30 are contemplated.

The roll 11 has a reference mark array FMA on its surface and has a degree of freedom in a rotational direction (θ direction), so that it turns or rotates about its major or central axis, to move the flexible multilayered circuit film S. The reference mark array FMA includes a plurality of reference marks FM for measuring the positions of the alignment scope units 20 on the roll 11. The flexible multilayered circuit film S has an alignment mark AM.

The reference mark array FMA is formed by forming the reference marks FM for measuring the positions of the alignment scope units 20 in an array on the roll 11, in order to obtain the position coordinates (in detail, the center coordinates) of the alignment scope units 20. The reference mark array FMA may be achieved by engraving the reference marks FM on the roll 11 or attaching a specific member or members to the roll 11 to form the reference marks FM.

Figure 3:
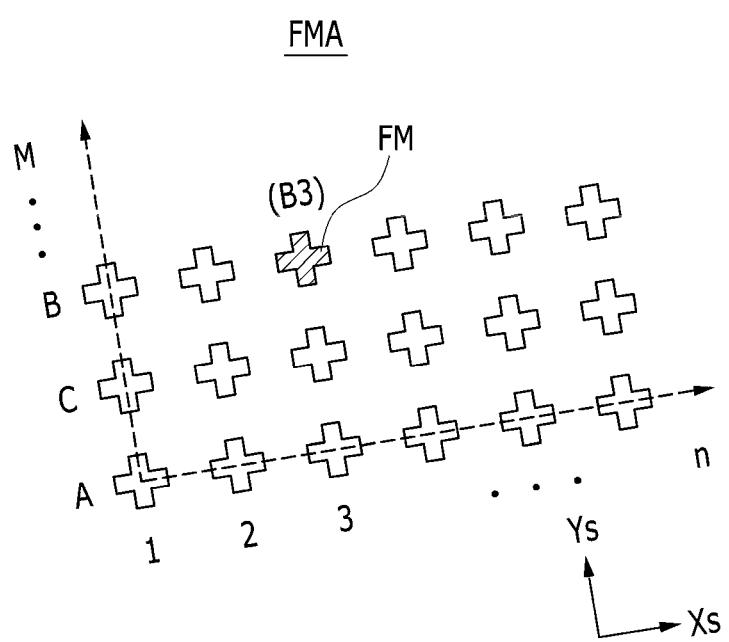
FIG. 3 is a top plan view illustrating further details of a coordinate system with reference marks as shown on the roll of FIG. 1.

FIG. 3 is a top plan view illustrating a coordinate system with reference marks FM on the roll of FIG. 1. Referring to FIGS. 1 and 3, the reference mark array FMA on the roll 11 of FIG. 1 may be illustrated in the coordinate system of FIG. 3 with respect to the flexible multilayered circuit film S moved by rotation of the roll 11. That is, in the reference mark array FMA, the plurality of reference marks FM are disposed at a predetermined distance from each other in a two-dimensional array of M (rows)×n (columns).

The reference marks FM are used as references for obtaining the position coordinates of the alignment scope units 20. The plurality of reference marks FM inscribed in a two-dimensional array on the reference mark array FMA may have an identifier. For example, FIG. 3 shows identifier B3 for the reference mark in the third column of row B.

Referring to FIGS. 1 and 2 again, the alignment scope units 20 are provided to measure the position and orientation of the flexible multilayered circuit film S on the roll 11. The alignment scope units 20 are disposed along the longitudinal direction of the roll 11 (x-axis direction).

The alignment scope units 20 are positioned along the length of the roll 11 and have degrees of freedom in the longitudinal direction (x-axis direction) and the rotational direction (θ direction) of the roll 11. The exposure units 30 have the same degrees of freedom as the alignment scope units 20, so that they can expose the flexible multilayered circuit film S. A configuration for implementing the degrees of freedom of the alignment scope units 20 and the exposure units 30 may be achieved in various ways as is known to those of ordinary skill in the art, and is thus not stated in the present exemplary embodiment.

Further, the roll-to-roll exposure system 1 of the first exemplary embodiment also includes a controller (not illustrated) that allows the flexible multilayered circuit film S to move by controlling the roll 11.

Further, the controller sets up the coordinate system of FIG. 3 by measuring the positions of the reference marks FM in the reference mark array FMA, moves the roll 11 such that a predetermined reference mark FM is positioned at the center of the FOV (Field Of View) of an alignment scope unit 20, and measures the position of the alignment scope unit 20.

Figure 4:
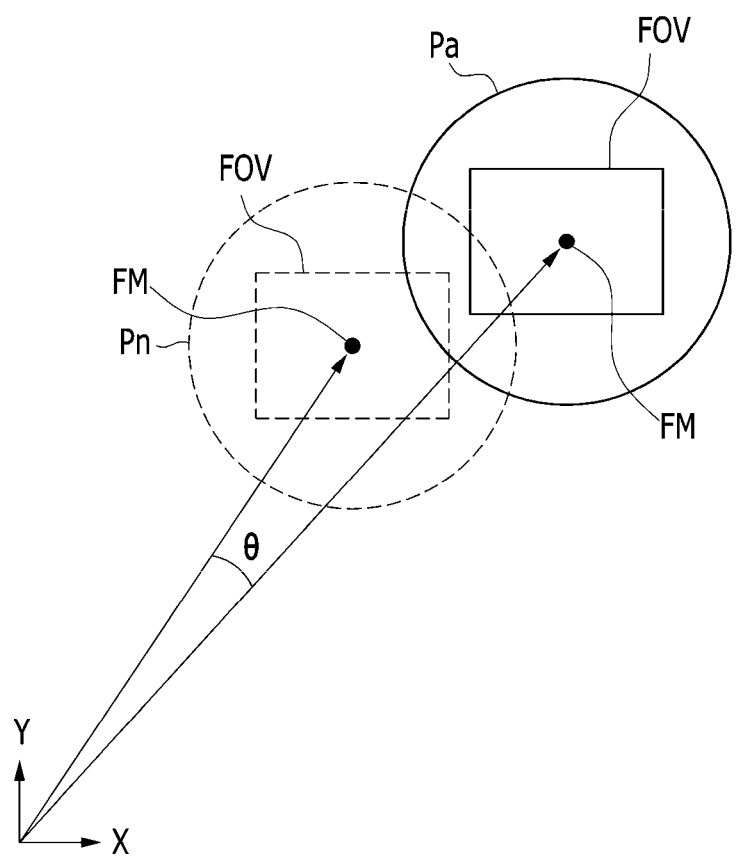
FIG. 4 is a view illustrating a process of obtaining position coordinates of an alignment scope unit using a reference mark in the roll-to-roll exposure system of FIG. 1.

FIG. 4 is a view illustrating a process of obtaining position coordinates of an alignment scope unit using a reference mark in the roll-to-roll exposure system of FIG. 1. Referring to FIG. 4, it is helpful to measure the precise position and orientation of an object on a flexible multilayered circuit film S in order to manufacture a flexible multilayered circuit film S having a layered structure in a roll-to-roll system. For example, the position and orientation of an object can be measured by an alignment scope unit 20 that is implemented by a microscope system An alignment scope unit 20 preferably is to be precisely mounted with respect to the roll 11, in order to determine accurate position information. However, in general, the axis of the roll 11 is tilted or made askew due to machining error and assembly error when equipment is manufactured, so it is helpful to measure first the position and orientation of an alignment scope unit 20.

To that end, a controller measures first the position and orientation of an alignment scope unit 20 over the roll 11, using a reference mark array FMA in a roll-to-roll system handling a flexible multilayered circuit film S.

The controller obtains the approximate position coordinates (nominal position Pn) of an alignment scope unit 20 using the reference marks FM in the reference mark array FMA on the roll 11, moves the roll 11 such that a predetermined reference mark FM is positioned at the center of an FOV of the alignment scope unit 20, and then obtains the precise position (actual position Pa) of the alignment scope unit 20. That is, so long as a reference mark FM is within the FOV, though not necessarily at the center of the FOV, of a unit 20, the approximate position of the unit 20 is taken as the position of that reference mark FM. The actual position of the unit 20 is then determined by moving the roll 11 so that the mark FM is positioned at the center of the FOV of the unit 20. As the position of the mark FM is known, the precise position of the unit 20 is then known as well. Furthermore, once the precise position of one unit 20 is known, the positions of the other units 20 and 30 are also known, as the relative positions of each are known.

Thereafter, the controller obtains image information about the object AM on the roll 11 through the corresponding alignment scope unit 20 whose position is now known, and thereby measures the position and orientation of the object AM on the flexible multilayered circuit film S in the coordinate system on the roll 11.

As described above, since the reference mark array FMA is on the roll 11, the alignment mark AM of the object on the roll 11 is read through an alignment scope unit 20 whose position is known. The film S is not easily deformed, since the roll 11 contacts and supports the film S.

A second exemplary embodiment of the present invention is described hereafter. Components that are identical or substantially the same as those already described above in connection with the first exemplary embodiments are not further described here.

Figure 5:
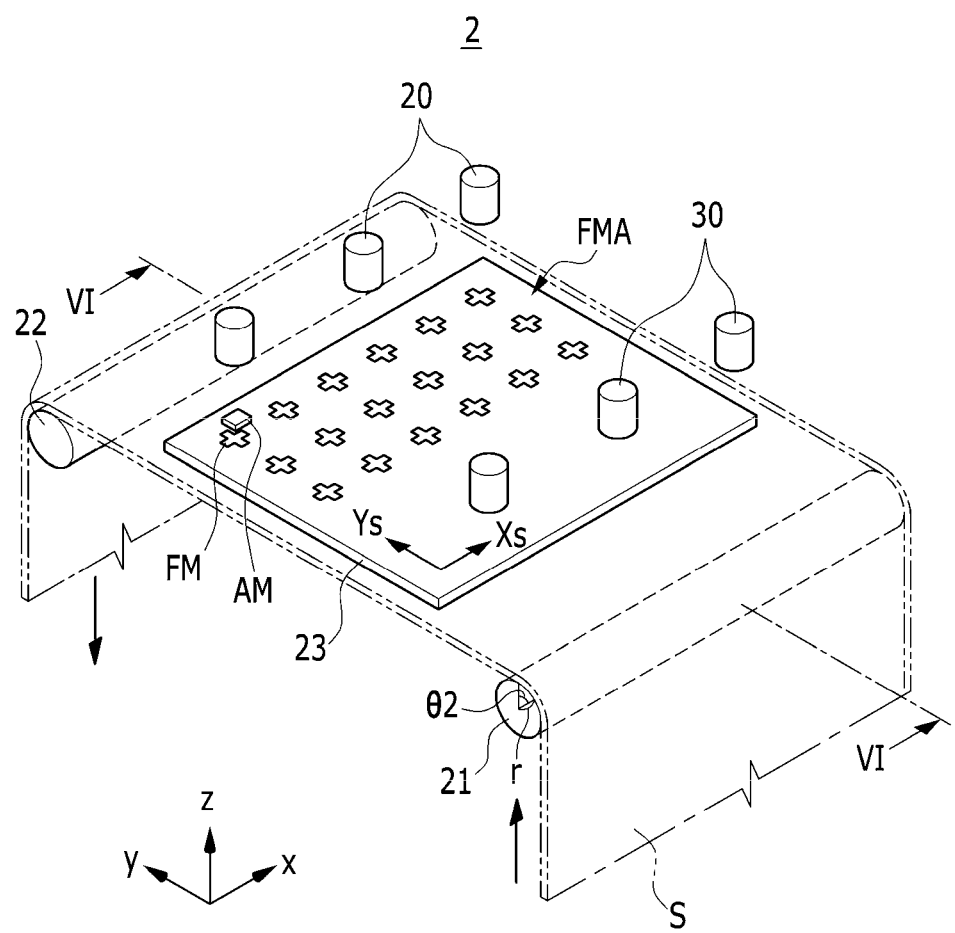
FIG. 5 is a perspective view illustrating a roll-to-roll exposure system according to a second exemplary embodiment of the present invention.
Figure 6:
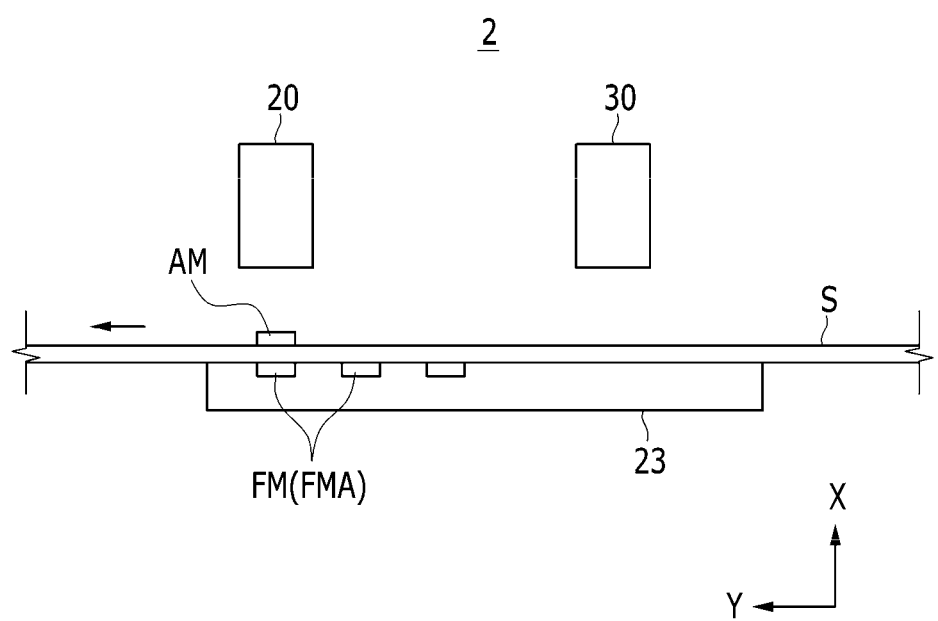
FIG. 6 is a cross-sectional view taken along line VI-VI in FIG. 5.

FIG. 5 is a perspective view illustrating a roll-to-roll exposure system according to a second exemplary embodiment of the present invention, and FIG. 6 is a cross-sectional view taken along line VI-VI of FIG. 5.

Referring to FIGS. 5 and 6, a roll-to-roll exposure system 2 of the second exemplary embodiment includes a table 23 between two rolls 21 and 22 that move a flexible multilayered circuit film S with one or more objects mounted thereon, in which exposure units 30 are disposed over the table 23.

A reference mark array FMA is provided on the table 23. For example, the reference mark array FMA may be achieved by engraving the table 23 or attaching a specific member to the table 23. Reference marks FM in the reference mark array FMA on the table 23 may be set in the coordinate system of FIG. 3 and used as reference marks for obtaining the position coordinates of alignment scope units 20.

The table 23 has a degree of freedom in the width direction (x-axis direction) of the flexible multilayered circuit film S and in the movement direction (y-axis direction) of the flexible multilayered circuit film S. Accordingly, the alignment scope units 20 are spaced apart from each other over and across the table 23, and have degrees of freedom in the width direction (x-axis direction) and the movement direction (y-axis direction).

The rolls 21 and 22 move in synchronization with the table 23 to move the film S along with the table 23 in the y-axis direction of the table 23. The y-axis directional stroke of the table 23 can be expressed by the equation $Yst=r\theta_2$. In this equation, r is the radius of the roll 21 and $\theta_2$ is a rotation angle of the roll 21. The rolls 21 and 22 also have a degree of freedom in the x-axis direction while moving in synchronization with the table 23 in consideration of the degree of freedom in the x-axial direction of the table 23.

The controller sets up the coordinate system of FIG. 3 by measuring the positions of the reference marks FM in the reference mark array FMA, moves the table 23 such that a predetermined reference mark FM is positioned at the center in an FOV of an alignment scope unit 20, and measures the position of the alignment scope unit 20.

The controller obtains the position coordinates (nominal position Pn) of an alignment scope unit 20 using the reference marks FM in the reference mark array FMA on the table 23, moves the table 23 such that a predetermined reference mark FM is positioned at the center of an FOV of a corresponding alignment scope unit 20, and obtains the position (actual position Pa) of the alignment scope unit 20 from the known position of its reference mark FM. This process is similar to that of the previous embodiment of FIG. 4. Once the actual position Pa of one unit 20 is known, the actual positions of the remaining units 20, 30 are also known, as the relative positions of each are known.

Thereafter, the controller obtains image information about the object on the table 23 through the alignment scope unit 20 of which the position and orientation was measured, and thereby measures the position and orientation of the object AM on the flexible multilayered circuit film S in the coordinate system on the table 23.

As described above, since the reference mark array FMA is on the table 23, the alignment mark AM of the object on the table 23 is read through an alignment scope unit 20 whose precise position has been determined. The film S is not easily deformed, since the table 23 contacts and supports the film S.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Furthermore, different features of the various embodiments, disclosed or otherwise understood, can be mixed and matched in any manner to produce further embodiments within the scope of the invention.

<Description Of Symbols>

| | |
|---|---|
| 1, 2: Roll-to-roll exposure system | 11, 12, 21, 22: Roll |
| 20: Alignment scope unit | 23: Table |
| 30: Exposure unit | AM: Alignment mark |
| FM: Reference mark | FMA: Reference mark array |
| r: Radius of roll | S: Flexible multilayered circuit film |
| θ: Rotational direction | $\theta_2$: Rotational angle of roll |

What is claimed is:

1. A roll-to-roll exposure system comprising:
   a plurality of rolls configured to move a flexible multilayered circuit film having an object disposed thereon;
   alignment scope units disposed so as to be spaced apart from each other and proximate to the rolls; and
   at least one exposure unit disposed so as to be spaced proximate to the rolls and spaced apart from sides of the alignment scope units,
   wherein one of the rolls has a reference mark array on its surface, and
   wherein the reference mark array is disposed on a region in which the flexible multilayered circuit film overlaps the one of the rolls.

2. The system of claim 1, wherein:
   the rolls have a degree of freedom in a rotational direction, and
   the alignment scope units have degrees of freedom in a longitudinal direction of the roll and the rotational direction.

3. The system of claim 2, wherein:
   the alignment scope units are arranged along the longitudinal direction of the rolls.

4. The system of claim 1, wherein:
the reference mark array comprises engravings or reference marks affixed to the roll.

5. A roll-to-roll exposure system comprising:
two rolls configured to move a flexible multilayered circuit film that has an object disposed thereon;
a table disposed between the rolls and disposed so as to fix and support the flexible multilayered circuit film;
alignment scope units disposed over the table; and
at least one exposure unit spaced proximate to the table and apart from sides of the alignment scope units,
wherein the table has at least one reference mark array on its surface, and
wherein the at least one reference mark array is disposed on a region in which the flexible multilayered circuit film overlaps the table.

6. The system of claim 5, wherein:
the reference mark array comprises engravings or reference marks affixed to the table.

7. The system of claim 6, wherein:
the table has a degree of freedom in a width direction (x-axis direction) of the flexible multilayered circuit film and a degree of freedom in a movement direction (y-axis direction) of the flexible multilayered circuit film, and
the alignment scope units have a plurality of degrees of freedom in the width direction (x-axis direction) and the movement direction (y-axis direction).

8. The system of claim 7, wherein:
the rolls are configured to move substantially in synchronization with the table such that the table has the degree of freedom in the y-axis direction, and
a y-axis directional stroke (Yst) of the table is determined according to $Yst = r\theta_2$, where r is a radius of the rolls and $\theta_2$ is an angle of rotation of the rolls.

9. The system of claim 8, wherein:
the rolls and the table each have a degree of freedom in the x-axis direction and so that the rolls are configured to move substantially in synchronization with the table.

* * * * *